(12) United States Patent
Huang et al.

(10) Patent No.: US 11,324,109 B2
(45) Date of Patent: May 3, 2022

(54) ELECTRONIC LOAD DEVICE AND HEAT-DISSIPATING LOAD MODULE

(71) Applicant: CHROMA ATE INC., Taoyuan (TW)

(72) Inventors: Chien-Hsing Huang, Tao-Yuan Hsien (TW); Chung-Lin Liu, Tao-Yuan Hsien (TW); Chien-Jiu Chou, Tao-Yuan Hsien (TW)

(73) Assignee: CHROMA ATE INC., Taoyuan (TW)

( * ) Notice: Subject to any disclaimer, the term of this patent is extended or adjusted under 35 U.S.C. 154(b) by 86 days.

(21) Appl. No.: 17/037,269

(22) Filed: Sep. 29, 2020

(65) Prior Publication Data
US 2021/0153336 A1    May 20, 2021

(30) Foreign Application Priority Data
Nov. 18, 2019 (TW) ................................. 108141702

(51) Int. Cl.
| | |
|---|---|
| *H05K 1/02* | (2006.01) |
| *H01R 12/57* | (2011.01) |
| *H05K 7/20* | (2006.01) |
| *H01L 23/367* | (2006.01) |
| *H01L 23/467* | (2006.01) |
| *H01L 23/40* | (2006.01) |

(52) U.S. Cl.
CPC .......... *H05K 1/0206* (2013.01); *H01R 12/57* (2013.01); *H05K 1/0207* (2013.01); *H01L 23/367* (2013.01); *H01L 23/467* (2013.01); *H01L 2023/4056* (2013.01); *H05K 7/20154* (2013.01); *H05K 7/20509* (2013.01)

(58) Field of Classification Search
CPC ......... H01L 23/367; H01L 23/40–4006; H01L 23/4093; H01L 2023/4081; H01L 2023/4037; H01L 2023/405; H01L 2023/4075–4087; H01R 12/57; H05K 7/2039; H05K 7/205; H05K 7/2089–209; H05K 7/20154; H05K 1/0201–0212; H05K 1/021; H05K 2201/06–068
See application file for complete search history.

(56) References Cited

U.S. PATENT DOCUMENTS

| | | | |
|---|---|---|---|
| 6,711,021 B1 * | 3/2004 | Morris ................... | H05K 1/141 |
| | | | 165/104.33 |
| 8,338,998 B2 * | 12/2012 | Yamasaki .............. | H02K 9/227 |
| | | | 310/64 |

(Continued)

*Primary Examiner* — Zachary Pape
*Assistant Examiner* — Amir A Jalali
(74) *Attorney, Agent, or Firm* — Muncy, Geissler, Olds & Lowe, PC (57) ABSTRACT

An electronic load device includes a main board and a load module. The main board has a plurality of first connecting ports. The load module includes a sub board and a heat-dissipating unit. The sub board has a second connecting port and a pin-hole port. The second connecting port is used for detachably connecting one of the plurality of first connecting ports. The pin-hole port is used for connecting a power component. The heat-dissipating unit has a cylindrical body and a plurality of heat-dissipating fins. The cylindrical body is defined with an outer surface and an inner surface opposite to the outer surface. The plurality of heat-dissipating fins is connected with the outer surface. When the power component is connected to the pin-hole port, the power component contacts the inner surface.

10 Claims, 5 Drawing Sheets

(56) References Cited

U.S. PATENT DOCUMENTS

| | | | |
|---|---|---|---|
| 2006/0187646 A1* | 8/2006 | Belson | H05K 1/141 361/719 |
| 2009/0120613 A1* | 5/2009 | Chen | H01L 23/4093 165/80.3 |
| 2011/0205726 A1* | 8/2011 | Hyun | F21V 7/05 362/84 |
| 2011/0222292 A1* | 9/2011 | Kong | F21V 29/763 362/294 |
| 2012/0080177 A1* | 4/2012 | Lee | F28D 15/046 165/185 |

* cited by examiner

ABSTRACT

ELECTRONIC LOAD DEVICE AND HEAT-DISSIPATING LOAD MODULE

This application claims the benefit of Taiwan Patent Application Serial No. 108141702, filed Nov. 18, 2019, the subject matter of which is incorporated herein by reference.

BACKGROUND OF THE INVENTION

(1) Field of the Invention

The invention relates to an electronic load device and a load module, and more particularly to an electronic load device and a heat-dissipating load module for the electronic load device.

(2) Description of the Prior Art

In meet various application scenarios and needs, products of the same series are likely to have models presenting different performances. For example, different models of the electronic load device may stand for different load powers. Generally speaking, to different models of the electronic load device, the corresponding number of the power components might be different. However, structuring of the heat-dissipating design is usually the same, particularly by adopting a design with the highest load power. In an exemplary example, if a series of the electronic load device is provided with loading performance options at 500 watts, 300 watts and 100 watts, the common heat-dissipating structure for this series would be practically based on the 500-watt loading performance. An obvious advantage from adopting a common heat-dissipating structure is the improvement of part commonality. Thus, the cost in research and manufacturing can be reduced without sacrificing work performance at any specific model.

Nevertheless, while in reducing the cost, some shortcomings may be still inevitable. For example, when a heat-dissipating structure designed for a 500-watt model is applied to a 100-watt or 300-watt model, the specification is undoubtedly over-satisfying the demand, and, at the same time, energy resources would be wasted for excessive heat dissipation capacity to cause an unnecessary burden upon the environment. In addition, in the case that a 100-watt or 300-watt model adopts a heat-dissipating structure designed for the 500-watt model, the associated entire occupation and weight of the 100-watt or 300-watt model would be irreducible. Thus, a new type of the electronic load device or the load module is needed, according to an anticipation that the waste of resources can be reduced while responding to various load powers.

SUMMARY OF THE INVENTION

Accordingly, it is an object of the present invention to provide an electronic load device having a modular load module, such that, according to different demands in loading performance, a different number of the load modules is provided. Thereupon, the energy consumption can be reduced, and also a small load-power electronic load device with a cumbersome size can be avoided.

In this invention, an electronic load device includes a main board and a load module. The main board has a plurality of first connecting ports. The load module includes a sub board and a heat-dissipating unit. The sub board has a second connecting port and a pin-hole port. The second connecting port is used for detachably connecting one of the plurality of first connecting ports. The pin-hole port is used for connecting a power component. The heat-dissipating unit has a cylindrical body and a plurality of heat-dissipating fins. The cylindrical body is defined with an outer surface and an inner surface opposite to the outer surface. The plurality of heat-dissipating fins is connected with the outer surface. When the power component is connected to the pin-hole port, the power component contacts the inner surface.

In one embodiment of the present invention, the electronic load device further includes fan unit detachably connected with the load module. The fan unit has a wind-out surface perpendicular to the inner surface. In addition, the electronic load device further includes a fixing bar and a mounting member. One of the plurality of heat-dissipating fins has a first positioning member, and the mounting member has a second positioning member. The fixing bar penetrates through the first positioning member and the second positioning member. The mounting member is disposed on the main board at the same side of the plurality of first connecting ports. In addition, the plurality of heat-dissipating fins protrude from the outer surface, and the heat-dissipating fin is spirally shaped.

In one embodiment of the present invention, the second connecting port of the sub board connects detachably one of the plurality of first connecting ports in a first direction, and the pin-hole port connects the power component in a second direction perpendicular to the first direction. In addition, the plurality of first connecting ports are arranged on a surface of the main board by equally spacing in a third direction perpendicular to the first direction. In addition, the inner surface of the cylindrical body defines thereinside an accommodation space, and the sub board shields at least part of an opening of the accommodation space in the third direction.

In the present invention, a heat-dissipating load module can be independently assembled to the electronic load device. The load module has an independent sub board. Thereupon, according to different demands in load power, the specific load module is then assembled onto the main board of the electronic load device. Thus, energy consumption can be reduced, and existence of a low-load model equipped with an excessively large heat-dissipating structure can be avoided.

In the present invention, a heat-dissipating load module includes a heat-dissipating unit and a sub board. The heat-dissipating unit has a cylindrical body and a plurality of heat-dissipating fins. The cylindrical body is defined with an outer surface and an inner surface opposite to the outer surface. The plurality of heat-dissipating fins are connected with the outer surface. The sub board is used for fixing a plurality of power components, the plurality of power components are disposed inside the accommodation space, and each of the plurality of power components contacts the inner surface. The heat-dissipating unit further has a first side and a second side, the cylindrical body is located between the first side and the second side, and the sub board shields at least an opening of the accommodation space at the first side.

In one embodiment of the present invention, the plurality of heat-dissipating fins protrude from the outer surface, and the heat-dissipating fin is spirally shaped. In addition, the inner surface has a plurality of flat areas, each of the plurality of flat areas is used for contacting one of the plurality of power components, and the plurality of flat areas are non-coplanar.

As stated above, the electronic load device provided by this invention can evaluate different loading demands to determine the number of the load modules for the main board of the device. In addition, since different load modules can adopt the same heat-dissipating units thought difference in quantity, not only the cost advantage brought by the high-degree commonality in parts can be obtained, but also existence of a low-load model equipped with an excessively large heat-dissipating structure can be avoided.

All these objects are achieved by the electronic load device and the heat-dissipating load module described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to an electronic load device and a heat-dissipating load module. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
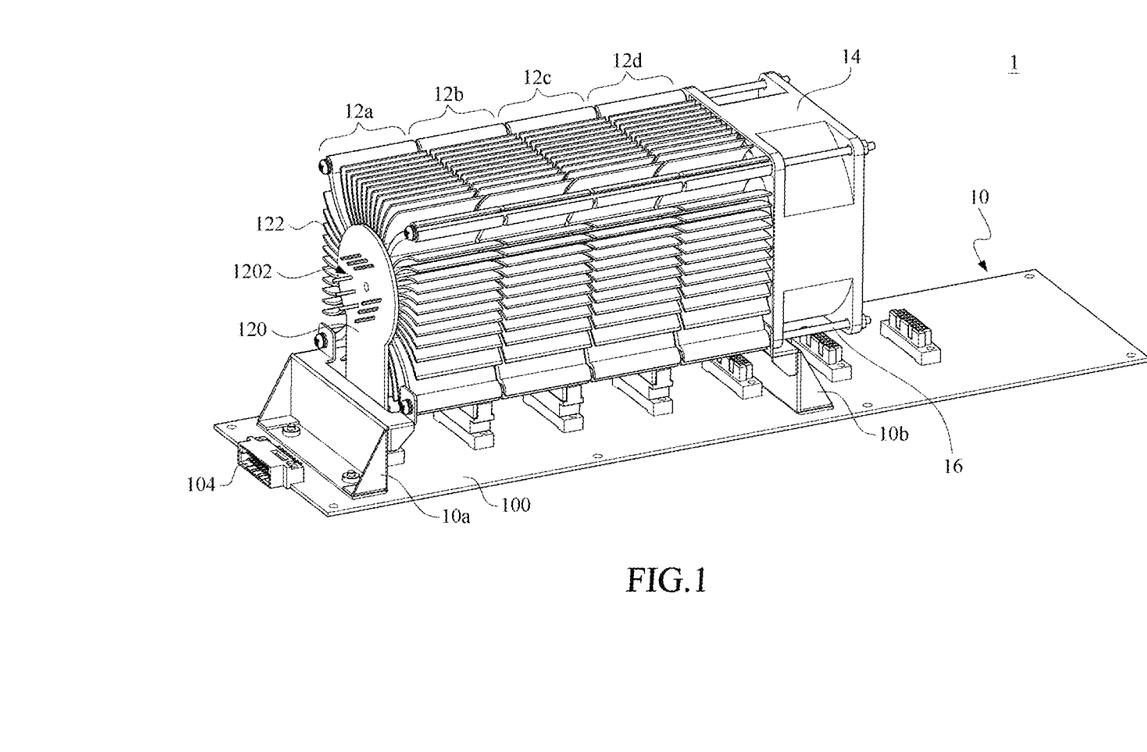
FIG. 1 is a schematic perspective view of a first embodiment of the electronic load device in accordance with the present invention.

Referring now to FIG. 1, a schematic perspective view of a first embodiment of the electronic load device in accordance with the present invention is shown. The electronic load device 1 includes a main board 10 and a plurality of load modules 12*a*-12*d*. One axial side of the load module 12*d* is connected with a fan unit 14. In FIG. 1, this embodiment 1 of the electronic load device includes, but not limited to, 4 load modules 12*a*-12*d*. However, the electronic load device 1 can simply include a load module 12*a*, or can include a plurality of load modules. In addition, the load modules 12*a*-12*d* can be set to be modules with the same or different load powers. In the case that the load powers of these modules are the same, a plurality of load modules would have largely the same appearances or dimensions. In addition, the electronic load device 1 can include a housing (not shown in the figure), and thus the main board 10, the plurality of load modules 12*a*-12*d* and the fan unit 14 are all installed inside the housing. In the following description, individual elements of the electronic load device 1 would be elucidated.

Figure 2:
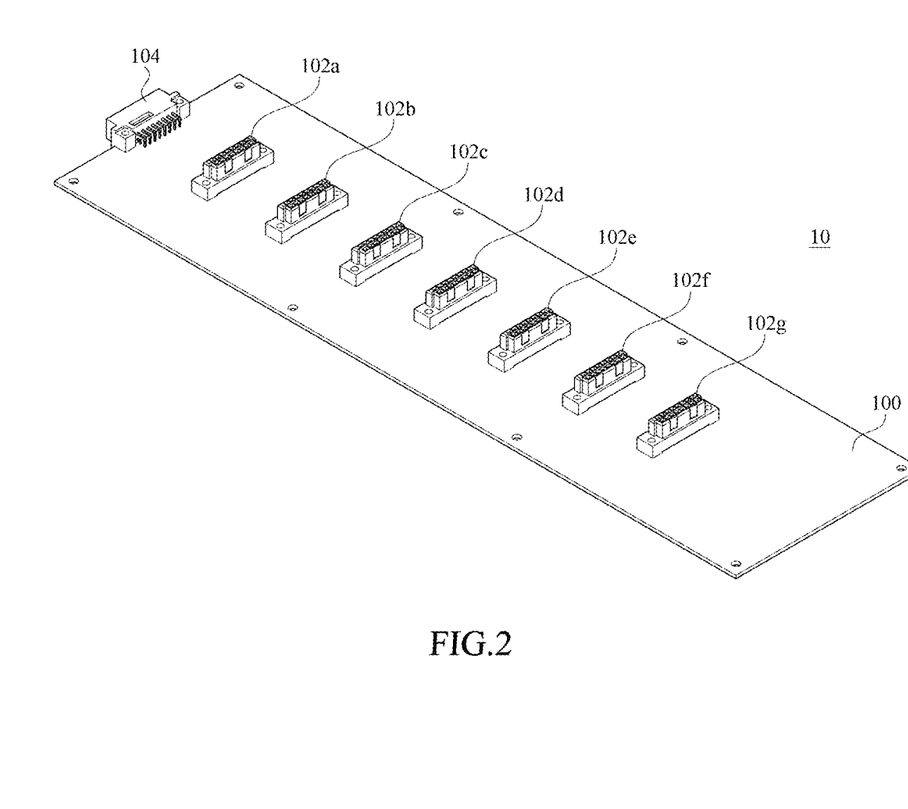
FIG. 2 is a schematic perspective view of the main board of FIG. 1.

Refer now to FIG. 1 and FIG. 2 together, where FIG. 2 is a schematic perspective view of the main board of FIG. 1. As shown, the main board 10 has a base plate 100, a plurality of first connecting ports 102*a*-102*g* furnished on the base plate 100 and an external connecting port 104. The base plate 100 can be a printed circuit board, and can be furnished with internal circuit wiring. The circuit wiring can be electrically connected with the first connecting ports 102*a*-102*g* and the external connecting port 104. The only requirement here is that the first connecting ports 102*a*-102*g* can be used for electrically connecting a plurality of load modules 12*a*-12*d*, and the external connecting port 104 can be electrically connected to a foreign power source or a control end to receive a current of a control signal. Thus, the skill person in the art can arbitrarily choose the specs of the first connecting ports 102*a*-102*g* and the external connecting port 104. Further, this embodiment does not limit the mounting positions of the first connecting ports 102*a*-102*g* and the external connecting port 104 on the base plate 100. For example, the first connecting ports 102*a*-102*g* can be arranged on the base plate 100 by equally spacing in a direction (i.e., a third direction), and the external connecting port 104 can be located on the base plate 100 by closing to one edge thereof.

In addition, this embodiment does not limit the quantity of the first connecting ports. Though six first connecting ports 102*a*-102 on the base plate 100 are shown in the figure, yet the quantity of the first connecting ports can be purposely increased or decreased according to the present invention. In particular, the quantity of the first connecting ports may be related to the maximum load power of the electronic load device 1. For instance, the more the quantity of the first connecting ports is, the higher the load power of the electronic load device 1 can be. Practically, each of the first connecting ports 102*a*-102*g* can be referred to a load module. As shown in the figure, the connecting port 102*a* can be corresponding to the load module 12*a*, the connecting port 102*b* can be corresponding to the load module 12*b*, and so on. If each of the load modules is 100 watts, for the main board 10 has 6 first connecting ports 102*a*-102*g*, then it can be deducted that the main board 10 can be applied to the models having a load power ranging from 100 watts to 600 watts. At this time, since the embodiment of the electronic load device 1 sketched in FIG. 1 has a main board 10 mounting 4 load module 12*a*-12*d*, then the model shown thereof can provide a load power of 400 watts. Of course, models with different load powers may apply different main boards. For example, in a 400-watt model, the model can have, but not limited to, 4 first connecting ports.

In addition, it is not necessary to have all the first connecting ports 102*a*-102*g* to connect with corresponding load modules. For example, the first connecting port and the load module may have different quantities. As shown in the figure, the first connecting ports 102*f* and 102*g* are free from connecting any load module. Of course, other embodiments of the present invention may involve different arrangements of connections with the first connecting ports. In one example, the load power of the electronic load device 1 further relates to each of the power components of the load module. For example, with a power component having a higher load power, the electronic load device 1 can provide more load power even the quantity of the connected load modules is the same. It shall be mentioned that this embodiment is only to demonstrate possible connections between the first connecting ports and the load powers, but not to limit the range of the load power of the electronic load device 1.

Figure 3:
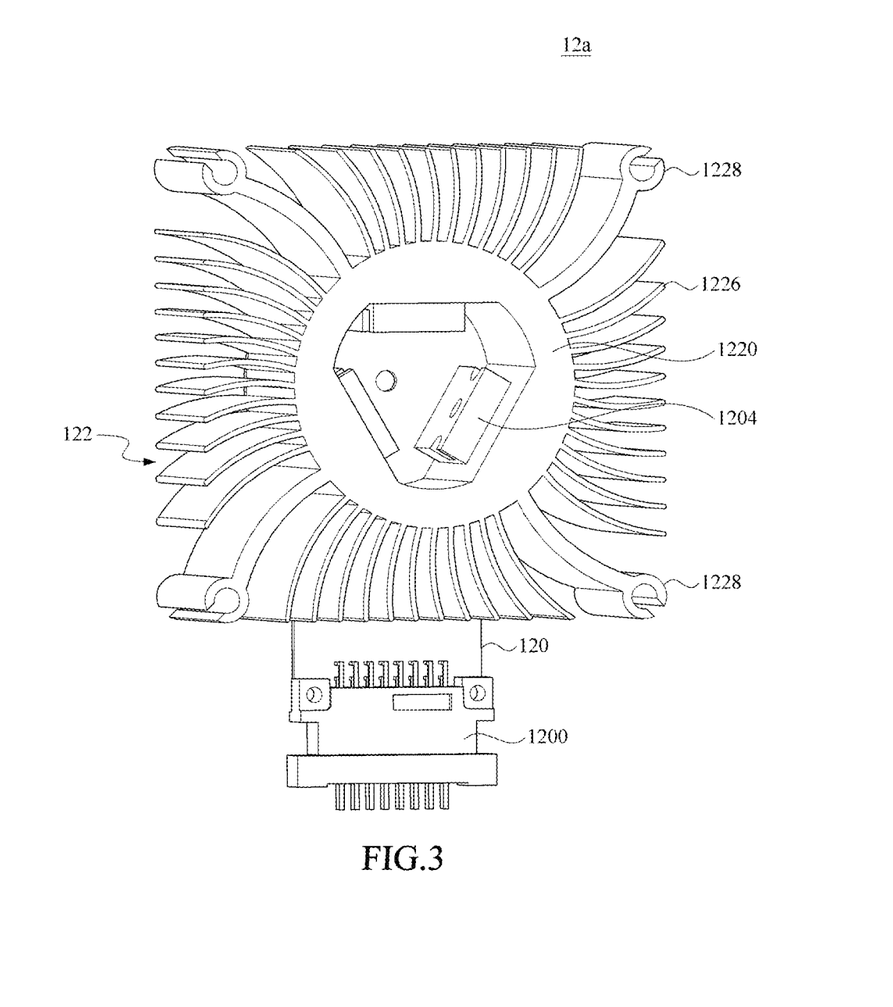
FIG. 3 is a schematic perspective view of the load module of FIG. 1.
Figure 4:
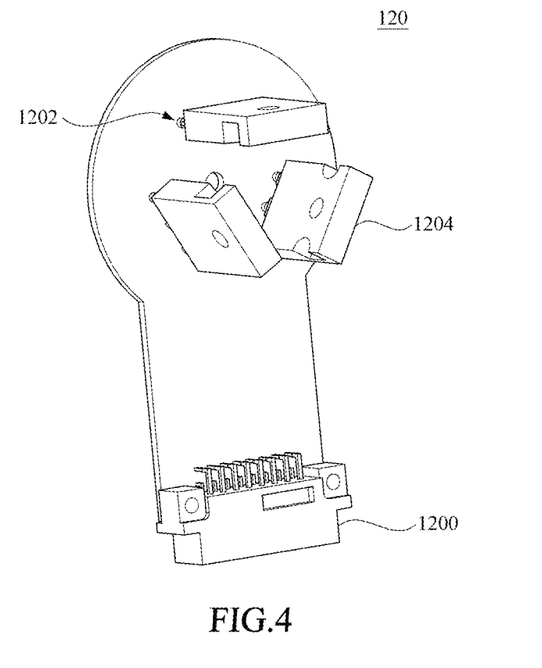
FIG. 4 is a schematic perspective view of the sub board and the power component of the load module of FIG. 3.
Figure 5:
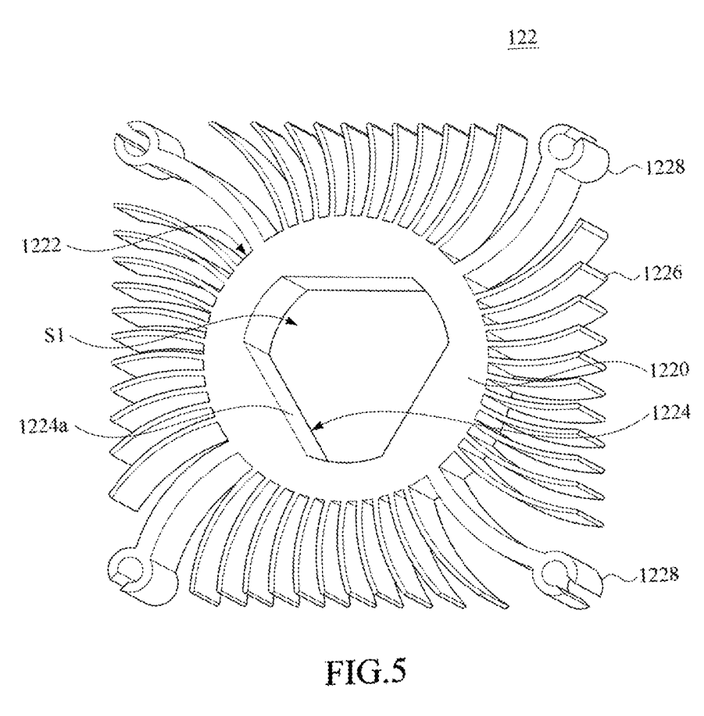
FIG. 5 is a schematic perspective view of the heat-dissipating unit of the load module of FIG. 3.

In order to elucidate the load module of this embodiment, please refer to FIG. 1 through FIG. 5; where FIG. 3 is a schematic perspective view of the load module of FIG. 1, FIG. 4 is a schematic perspective view of the sub board and the power component of the load module of FIG. 3, and FIG. 5 is a schematic perspective view of the heat-dissipating unit of the load module of FIG. 3. As shown, in FIG. 3 through FIG. 5, one of the load modules 12a-12d are selected for demonstration. For instance, by having the load module 12a as an example, the load module 12a can include a sub board 120 and a heat-dissipating unit 122, in which the sub board 120 has a second connecting port 1200 and at least one pin-hole port 1202. The second connecting port 1200 is used for detachably connecting one of the plurality of first connecting ports 102a-102g, such as the first connecting port 102a shown in FIG. 2. Since the first connecting ports 102a-102g may have the same specs, the load module 12a can be connected with any one of the first connecting ports. In one example, the sub board 120 can be a printed circuit board having internal circuit wiring, similar to the base plate 100. The aforesaid circuit wiring can be used for electrically connecting the second connecting port 1200 and the pin-hole ports 1202. Here, the pin-hole port 1202 can be further used for connecting the respective power component 1204, such that foreign power can energize the device through the external connecting port 104, the base plate 100, the first connecting port 102a, the second connecting port 1200, the sub board 120, the pin-hole ports 1202 and the corresponding power components 1204.

As shown, the second connecting port 1200 can detachably connect the first connecting port 102a in a direction perpendicular to the base plate 100 (i.e., in the first direction), so that the sub board 120 can stand at a side of the base plate 100. This embodiment is not used for limiting the spec of the second connecting port 120. Practically, only if the first connecting port 102a can connect the second connecting port 1200 to transmit currents or control signals, such an embodiment can be said to be within the scope of the second connecting ports 1200. In addition, the pin-hole port 1202 can include one or a plurality of vias on the sub board 120, such that pins of the power component 1204 can be plugged into corresponding vias of the respect pin-hole port 1202. Thereupon, the power component 1204 can be electrically connected to the internal circuit wiring of the sub board 120. At this time, the power component 1204 can be vertically plugged into the corresponding pin-hole port 1202 of the sub board 120 in the second direction. In other words, the pin-hole port 1202 provides a port for mounting the power component 1204. In one embodiment, the sub board 120 can be furnished with a plurality of pin-hole ports 1202. By having FIG. 4 as an example, three pin-hole ports 1202 are furnished to the sub board 120, and each of the pin-hole ports 1202 is connected to a respective power component 1204.

Practically, the power component 1204 would generate heat while in working. Thus, the plurality of pin-hole ports 1202 shall be isolated from each other so as to prevent the power components 1204 from any direct contact. In order to meet a need in heat dissipation, the load module 12a further has a heat-dissipating unit 122. The heat-dissipating unit 122 has a cylindrical body 1220 defined with an outer surface 1222 and an inner surface 1224 opposite to the outer surface 1222. Visually, the cylindrical body 1220 can be a hollow structure having the inner surface 1224 to define thereinside an accommodation space S1. As shown, the inner surface 1224 can be part of a peripheral wall that surrounds, not wraps, the accommodation space S1. For example, the accommodation space S1 can have two opposite openings respectively at two opposing end sides of the cylindrical body 1220. When the sub board 120 and the heat-dissipating unit 122 are integrated together, the sub board 120 would be disposed adjacent to one axial side of the cylindrical body 1220 so as to have each of the power components 1204 to protrude into the accommodation space S1 by having individual contact with the inner surface 1224. In particular, the sub board 120 would shield part of the corresponding opening of the accommodation space S1.

As shown, in this embodiment, since each of the power components 1204 is largely cubic shaped, and in order to have each of the power components 1204 further to contact tightly with the inner surface 1224, so the inner surface 1224 provides thereof flat areas 1224a for the individual power components 1204 to perform respective close contacts. Namely, the flat areas 1224a and the power components 1204 are disposed to form a one-to-one relationship. Thereupon, one side of the power component 1204 would contact the inner surface 1224 to facilitate heat conduction in between. In other words, according to the quantity of the power components 1204 mounted on the sub board 120, the shape of the inner surface 1224 of the cylindrical body 1220 or the number of the flat areas 1224a can be determined. For example, in this embodiment, since these three power components 1204 electrically mounted on the sub board 120 form a triangle, thus the three flat areas 1224a of the inner surface 1224 of the cylindrical body 1220 are non-coplanar, such that all these three power components 1204 can contact tightly with the inner surface 1224.

In addition, when the sub board 120 and the heat-dissipating unit 122 are integrated together, fixedly or not. Practically, if the power components 1204 can be tightly adhered onto the corresponding flat areas 1224a of the inner surface 1224, the efficiency of heat conduction would be enhanced definitely. To achieve this goal, the power components 1204 can be adhered onto the corresponding flat areas 1224a of the inner surface 1224 by a thermally conductive adhesive, or the power components 1204 can be directly locked or buckled to the corresponding flat areas 1224a of the inner surface 1224. In one example, the power components 1204 can be simply inserted into the accommodation space S1 so as to have the power components 1204 to touch the corresponding flat areas 1224a of the inner surface 1224, not particularly to adhere or fix the power components 1204 to the corresponding flat areas 1224a of the inner surface 1224.

On the other hand, the outer surface 1222 of the cylindrical body 1220 can connect a plurality of heat-dissipating fins 1226. As shown, each of the heat-dissipating fins 1226 is spirally shaped so as to increase the wind-facing area. In addition, part of the heat-dissipating fins 1226 mainly for dissipating heat are furnished with the positioning members 1228 (i.e., the first positioning members). Practically, the heat-dissipating fins 1226 disposed at the corners are the fins to have the positioning members 1228, and thus the positioning members 1228 would be plural and symmetrically arranged. However, it shall be understood that this embodiment is not applied to limit possible positions for locating the positioning members 1228. Only if the positioning member 1228 can be used for buckling the fixing bar 16 of FIG. 1, it is thus within the scope of the positioning member 1228 defined in this embodiment. In an exemplary example, when the load modules 12a-12d are individually connected with the corresponding first connecting ports 102a-102d, the first connecting ports 102a and the respective second connecting ports 1200 are connected together so as to fix the load modules 12a-12d. Obviously, such a design may be structurally weak and less stable. At this time, for promoting the structural rigidity, the electronic load device 1 can apply a plurality of fixing bars 16 to lock each of the heat-dissipating units 122 of the load module 12a-12d together. Of course, this embodiment is limited to the usage of the fixing bars 16. For example, the housing of the electronic load device 1 can be also applied to fix the relative positions between the main board 10 and the load modules 12a-12d, and thus the electronic load device 1 without the fixing bars 16 can still work.

In addition, the base plate 100 of the main board 10 is further furnished thereon detachable mounting members 10a, 10b. In this embodiment, according to the quantity of the load module, positions for constructing the mounting members 10a, 10b can be determined. Referring to FIG. 1, since the main board 10 connects thereon four load modules 12a-12d, thus the mounting member 10a can be disposed at one side of the load module 12a, while the mounting member 10b is disposed at another side of the load module 12d. Thereupon, the load modules 12a-12d can be clamped between the two mounting members 10a, 10b. In addition, each of the mounting members 10a, 10b can be further furnished with through holes (i.e., the second positioning members). Then, the fixing bar 16 can be applied to connect the mounting members 10a, 10b and the heat-dissipating units 122 of the load modules 12a-12d in series. Since the mounting members 10a, 10b are directly fixed to the base plate 100, integrity of the device can be further ensured, in comparison with the aforesaid method that connects the load modules 12a-12d by the first connecting ports 102a and the second connecting ports 1200. As described above, this embodiment is not limited to the mounting members 10a, 10b. For example, the housing of the electronic load device 1 can be used to clamp the load modules 12a-12d, and thus the electronic load device 1 can still work even the mounting members 10a, 10b are not applied.

In order to increase the heat-dissipating efficiency of the heat-dissipating fins 1226, the electronic load device 1 can be further furnished with a fan unit 14 for generating an enforced airflow to carry away the heat at the heat-dissipating fins 1226. In one example, the fan unit 14 has a wind-flowing direction toward the sub board 120, or in parallel to the in-series direction of the first connecting ports 102a-102g. Since one open end of the cylindrical body 1220 is shielded by the sub board 120, thus less air would be introduced into the accommodation space S1 at this end, but more air would pass through the heat-dissipating fins 1226. Though the fan unit 14 of FIG. 1 is disposed on the mounting member 10b, yet the fan unit 14 can be still disposed above the other mounting member 10a. Similarly, the fan unit 14 can be also furnished with through holes, and thus the fixing bars 16 can be applied to connect the mounting members 10a, 10b, all the heat-dissipating units 122 of the load modules 12a-12d, and the fan unit 14 in series. In one example, in a circumstance without the mounting members 10a, 10b, the fan unit 14 can be also connected in series to the load modules 12a-12d via the fixing bars 16. However, in another example, the fan unit 14 can be fixed to the housing of the electronic load device 1.

In summary, the electronic load device provided by this invention can evaluate different loading demands to determine the number of the load modules on the main board of the device. In addition, since the load modules can adopt the same heat-dissipating units thought difference in quantity, not only the cost advantage brought by the high-degree commonality in parts can be obtained, but also existence of a low-load model equipped with an excessively large heat-dissipating structure can be avoided.

While the present invention has been particularly shown and described with reference to a preferred embodiment, it will be understood by those skilled in the art that various changes in form and detail may be without departing from the spirit and scope of the present invention.

What is claimed is:

1. An electronic load device, comprising:
   a main board, having a plurality of first connecting ports; and
   a load module, including:
      a sub board, having a second connecting port and a pin-hole port, the second connecting port being used for detachably connecting one of the plurality of first connecting ports, the pin-hole port being used for connecting a power component; and
      a heat-dissipating unit, having a cylindrical body and a plurality of heat-dissipating fins, the cylindrical body defined with an outer surface and an inner surface opposite to the outer surface, the plurality of heat-dissipating fins being connected with the outer surface;
   wherein, when the power component is connected to the pin-hole port, the power component contacts the inner surface.

2. The electronic load device of claim 1, further including a fan unit detachably connected with the load module, the fan unit having a wind-out surface perpendicular to the inner surface.

3. The electronic load device of claim 1, further including a fixing bar and a mounting member, one of the plurality of heat-dissipating fins having a first positioning member, the mounting member being disposed on the main board and having a second positioning member, the fixing bar penetrating through the first positioning member and the second positioning member.

4. The electronic load device of claim 1, wherein the second connecting port of the sub board connects detachably one of the plurality of first connecting ports in a first direction, and the pin-hole port connects the power component in a second direction perpendicular to the first direction.

5. The electronic load device of claim 4, wherein the plurality of first connecting ports are arranged on a surface of the main board by equally spacing in a third direction perpendicular to the first direction.

6. The electronic load device of claim 5, wherein the inner surface of the cylindrical body defines thereinside an accommodation space, and the sub board shields at least part of an opening of the accommodation space in the third direction.

7. The electronic load device of claim 1, wherein the plurality of heat-dissipating fins are protruded from the outer surface, and the heat-dissipating fin is spirally shaped.

8. A heat-dissipating load module, comprising:
   a heat-dissipating unit, having a cylindrical body and a plurality of heat-dissipating fins, the cylindrical body defining an outer surface and an inner surface opposite to the outer surface, the inner surface defining thereinside an accommodation space, the plurality of heat-dissipating fins being connected with the outer surface; and
   a sub board, used for fixing a plurality of power components, the plurality of power components being disposed in the accommodation space, each of the plurality of power components contacting the inner surface;
   wherein the heat-dissipating unit further has a first side and a second side, the cylindrical body is located between the first side and the second side, and the sub board shields at least an opening of the accommodation space at the first side.

9. The heat-dissipating load module of claim 8, wherein the plurality of heat-dissipating fins protrude from the outer surface, and the heat-dissipating fin is spirally shaped.

10. The heat-dissipating load module of claim 8, wherein the inner surface has a plurality of flat areas, each of the plurality of flat areas is used for contacting one of the plurality of power components, and the plurality of flat areas are non-coplanar.

\* \* \* \* \*